US008187965B2

(12) United States Patent
Lin et al.

(10) Patent No.: US 8,187,965 B2
(45) Date of Patent: May 29, 2012

(54) WIREBOND PAD FOR SEMICONDUCTOR CHIP OR WAFER

(75) Inventors: Mou-Shiung Lin, Hsinchu (TW); Michael Chen, Tainan (TW); Chien-Kang Chou, Tainan (TW); Mark Chou, Kaoshiang (TW)

(73) Assignee: Megica Corporation, Hsinchu (TW)

( * ) Notice: Subject to any disclaimer, the term of this patent is extended or adjusted under 35 U.S.C. 154(b) by 359 days.

(21) Appl. No.: 11/756,621

(22) Filed: May 31, 2007

(65) Prior Publication Data
US 2009/0053887 A1 Feb. 26, 2009

Related U.S. Application Data

(63) Continuation of application No. 10/796,427, filed on Mar. 9, 2004, now Pat. No. 7,470,997.

(60) Provisional application No. 60/489,564, filed on Jul. 23, 2003.

(51) Int. Cl.
*H01L 21/44* (2006.01)

(52) U.S. Cl. ................. 438/617; 257/E21.476

(58) Field of Classification Search ........... 257/E21.476; 438/617
See application file for complete search history.

(56) References Cited

U.S. PATENT DOCUMENTS

| 4,622,576 | A | 11/1986 | Buynoski |
| 4,733,289 | A | 3/1988 | Tsurumaru |
| 5,134,460 | A | 7/1992 | Brady |
| 5,137,845 | A | 8/1992 | Lochon |
| 5,172,212 | A | 12/1992 | Baba |
| 5,223,454 | A | 6/1993 | Uda |
| 5,268,072 | A | 12/1993 | Agarwala |
| 5,310,699 | A | 5/1994 | Chikawa et al. |
| 5,326,709 | A | 7/1994 | Moon |
| 5,503,286 | A | 4/1996 | Nye, III |
| 5,554,940 | A | 9/1996 | Hubacher |
| 5,656,863 | A | 8/1997 | Yasunaga |
| 5,736,791 | A | 4/1998 | Fujiki |
| 5,756,370 | A | 5/1998 | Farnworth |
| 5,783,868 | A | 7/1998 | Galloway |
| 5,785,236 | A | * 7/1998 | Cheung et al. ............ 228/180.5 |
| 5,877,078 | A | 3/1999 | Yanagida |
| 5,903,343 | A | 5/1999 | Ning |
| 5,946,590 | A | 8/1999 | Satoh |
| 5,985,765 | A | 11/1999 | Hsiao |

(Continued)

FOREIGN PATENT DOCUMENTS

TW 447103 7/2001

(Continued)

OTHER PUBLICATIONS

U.S. Appl. No. 10/154,662, filed May 24, 2002, Megica Corporation.

(Continued)

*Primary Examiner* — Zandra Smith
*Assistant Examiner* — Marvin Payen
(74) *Attorney, Agent, or Firm* — McDermott Will & Emery LLP

(57) ABSTRACT

In the present invention, copper interconnection with metal caps is extended to the post-passivation interconnection process. Metal caps may be aluminum. A gold pad may be formed on the metal caps to allow wire bonding and testing applications. Various post-passivation passive components may be formed on the integrated circuit and connected via the metal caps.

27 Claims, 5 Drawing Sheets

U.S. PATENT DOCUMENTS

| | | | |
|---|---|---|---|
| 6,028,363 | A | 2/2000 | Lin |
| 6,075,290 | A | 6/2000 | Schaefer |
| 6,077,726 | A | 6/2000 | Mistry |
| 6,144,102 | A | 11/2000 | Amagai |
| 6,162,652 | A | 12/2000 | Dass |
| 6,194,309 | B1 | 2/2001 | Jin |
| 6,197,613 | B1 | 3/2001 | Kung |
| 6,229,220 | B1 | 5/2001 | Saitoh |
| 6,271,107 | B1 | 8/2001 | Massingill |
| 6,303,423 | B1 | 10/2001 | Lin |
| 6,319,830 | B1 | 11/2001 | Yamaguchi |
| 6,332,988 | B1 | 12/2001 | Berger, Jr. |
| 6,376,353 | B1 | 4/2002 | Zhou et al. |
| 6,383,916 | B1 | 5/2002 | Lin |
| 6,406,967 | B1 | 6/2002 | Chung |
| 6,426,556 | B1 | 7/2002 | Lin |
| 6,429,531 | B1 | 8/2002 | Mistry |
| 6,451,681 | B1 | 9/2002 | Greer |
| 6,452,270 | B1 | 9/2002 | Huang |
| 6,495,442 | B1 | 12/2002 | Lin et al. |
| 6,515,369 | B1 | 2/2003 | Lin |
| 6,518,651 | B2 | 2/2003 | Hashimoto |
| 6,544,880 | B1 | 4/2003 | Akram |
| 6,545,355 | B2 | 4/2003 | Yanagida |
| 6,709,985 | B1 | 3/2004 | Goruganthu |
| 6,720,243 | B2 | 4/2004 | Weng |
| 6,806,578 | B2 | 10/2004 | Howell et al. |
| 6,815,324 | B2 | 11/2004 | Huang |
| 6,861,742 | B2 | 3/2005 | Miyamoto |
| 7,034,402 | B1 | 4/2006 | Seshan |
| 2003/0222295 | A1 | 12/2003 | Lin |
| 2004/0016948 | A1 | 1/2004 | Lin |
| 2004/0029404 | A1 | 2/2004 | Lin |
| 2004/0070086 | A1* | 4/2004 | Lee et al. ............ 257/784 |
| 2005/0017361 | A1 | 1/2005 | Lin |

FOREIGN PATENT DOCUMENTS

| | | |
|---|---|---|
| TW | 489498 | 6/2002 |
| TW | 506045 | 10/2002 |
| TW | 516191 | 1/2003 |
| TW | 529144 | 4/2003 |
| TW | 531870 | 5/2003 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/Silk™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

WIREBOND PAD FOR SEMICONDUCTOR CHIP OR WAFER

This application is a continuation application of Ser. No. 10/796,427 filed on Mar. 9, 2004, now U.S. Pat. No. 7,470,997, which claims priority to U.S. Provisional Patent Application Ser. No. 60/489564, filed on Jul. 23, 2003, both of which are herein incorporated by reference in their entirety.

RELATED PATENT APPLICATIONS

This application is related to Ser. No. 10/154,662, filed on May 24, 2002, and assigned to a common assignee.

This application is related to Ser. No. 10/445,558, filed on May 27, 2003, and assigned to a common assignee.

This application is related to Ser. No. 10/445,559, filed on May 27, 2003, and assigned to a common assignee.

This application is related to Ser. No. 10/445,560, filed on May 27, 2003, and assigned to a common assignee.

BACKGROUND OF THE INVENTION

1. Field of the Invention

This invention relates to structures and methods of assembly of integrated circuit chips. More particularly, this invention relates to post-passivation technologies with metal caps.

2. Description of the Related Art

Copper interconnection requires an aluminum cap at the passivation openings to protect the copper from environmental deterioration such as oxidation from the ambient and to provide a metal pad for wire bonding. Today many integrated circuit chips use copper as the interconnection metal. From a performance perspective, copper interconnection offers a higher propagation speed than does an aluminum interconnection, making copper a desirable technological solution for current IC design. However, copper interconnection also incurs reliability concerns. When a copper I/O pad is exposed to atmosphere, its surface is subjected to chemical attack by the oxygen and moisture in the atmosphere. To overcome this problem, prior art has disclosed a method and structure to prevent copper chemical attack. By depositing a metal (such as aluminum (Al)) cap layer on the surface of the copper I/O pad, the copper I/O pad can remain intact in the passivation opening in the ambient. This metal cap layer is especially important where processing through the passivation layer is performed in one fab and then post-passivation processing is performed in another fab. Moreover, an Al (or other metal) pad is able to form a stable bonding structure with Au wire. Copper alone cannot form a bondable structure with Au wire. Therefore, the Al cap layer provides the wire-bonding capability for the copper I/O pad. FIG. 1 shows an aluminum cap 32 on a copper line 24. The Al cap allows the formation of a wire bond 40 attaching to it firmly. For example, U.S. Pat. Nos. 6,451,681 to Greer and 6,376,353 to Zhou teach using an Al cap over a copper bond pad for wire bonding. U.S. Pat. No. 6,544,880 to Akram discloses gold over a copper pad and optionally additional metals to prevent formation of intermetallic compounds in wire bonding.

U.S. Pat. Nos. 6,495,442 and 6,383,916 to M. S. Lin et al disclose a post-passivation interconnection process. The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the sub-micron range. The main components that offer a challenge in this respect are capacitors and inductors, since both these components are, for typical analog processing circuits, of considerable size.

One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate. Co-pending U.S. patent applications Ser. Nos. 10/445,558, 10/445,559, and 10/445,560 apply the post-passivation process of U.S. Pat. No. 6,383,916 in addition to creating high quality electrical components, such as an inductor, a capacitor or a resistor, on a layer of passivation or on the surface of a thick layer of dielectric.

SUMMARY OF THE INVENTION

An object of this invention is to provide post-passivation interconnection wherein copper pads are capped with metal pads.

Another object of this invention is to provide post-passivation metal interconnection for wire bonding or testing purposes wherein copper pads are capped with a different metal.

A further object is to provide post-passivation metal interconnection for wire bonding or testing purposes wherein copper pads are capped with another metal and further covered with gold.

Another object is to deposit thin film passive components on top of an inductor using copper pads capped with aluminum as the connecting node.

Another object is to attach surface mounted passive components such as capacitors, resistors, and inductors to wirebonds through post-passivation metal lines above the passivation layer.

In accordance with the objects of the invention, a high performance integrated circuit chip is disclosed.

Also in accordance with the objects of the invention, a method of fabricating a high performance integrated circuit chip is achieved.

DETAILED DESCRIPTION OF THE INVENTION

The prior art did not extend the application of a metal cap layer to other useful applications such as post-passivation interconnection or testing through the redistribution layer (RDL). The present invention discloses a structure and method to extend the concept of a metal cap on a copper interconnection to a post-passivation interconnection scheme. In a post passivation processing sequence, as described in copending U.S. patent application Ser. No. 10/154,662 filed on May 24, 2002 and herein incorporated by reference, a thick layer of dielectric is optionally deposited over a layer of passivation and layers of wide and thick metal lines are formed on top of the thick layer of dielectric.

By adding a post-passivation interconnection scheme on a metal (such as Al) pad, where the post-passivation metal is, for example, gold or copper, several advantages emerge. A post-passivation metal trace can be formed either as a stripe or a meander line. When the trace is formed as a stripe, the stripe offers itself as an alternative testing site or as a wire-bonding site for the metal cap. When the trace meanders through several I/O pads, it serves virtually as an alternative interconnection scheme for the IC chip. It is much coarser and hence, faster than is the fine line interconnection line located under the passivation layer. Post-passivation metal also allows one to place passive components such as a capacitor, resistor, or inductor on an IC chip, as taught in co-pending U.S. patent application Ser. No. 10/445,558 to M. S. Lin et al, herein incorporated by reference.

In brief, post-passivation interconnection offers three essential advantages to IC chips: post-passivation interconnection
1) lowers parasitic resistance and capacitance to enhance the speed of the IC chip,
2) facilitates system-on-a-chip (SOC) and system-in-a-package (SIP) design with on-chip passive structures, and
3) allows Au interconnection offering wire bonding capability and testing capability to the IC chip.

When a Au/Al dual cap layer is used as the wire bonding pad on the copper I/O pad, the Au pad provides better performance than does the Al pad because the Au pad bears superior bondability and protection for the active devices. A barrier layer of, for example, TiW is typically formed between the Al cap and the overlying Au.

A Au pad also offers protection for the active devices as described in co-pending U.S. patent application Ser. No. 10/434,142 (MEG-02-008), filed on May 8, 2003, and herein incorporated by reference. This is due mainly to the ductility of gold. When conducting testing or during the wire-bonding process, the gold pad is able to absorb the mechanical energy caused by impetus from a stylus. Thus, the active devices underneath can be protected.

It will be understood by those skilled in the art that the present invention should not be limited to any of the examples shown, but can be extended and applied to any kind of IC chip design.

Figure 1:
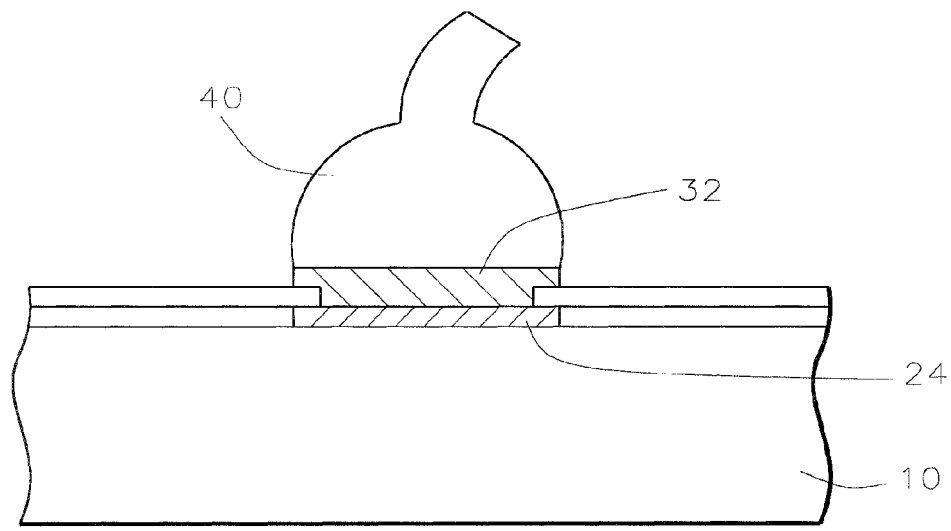
FIG. 1 shows a cross-sectional view of a wire bond of the prior art.
Figure 2:
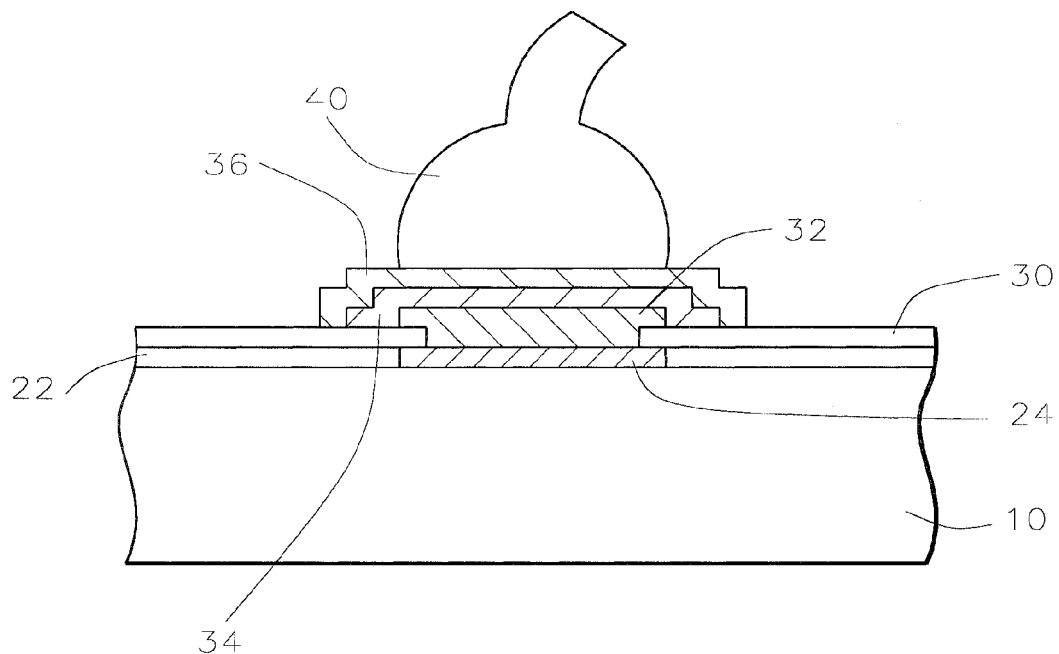
FIG. 2 shows a cross-sectional view of a wire bonding application of the present invention.
Figure 3:
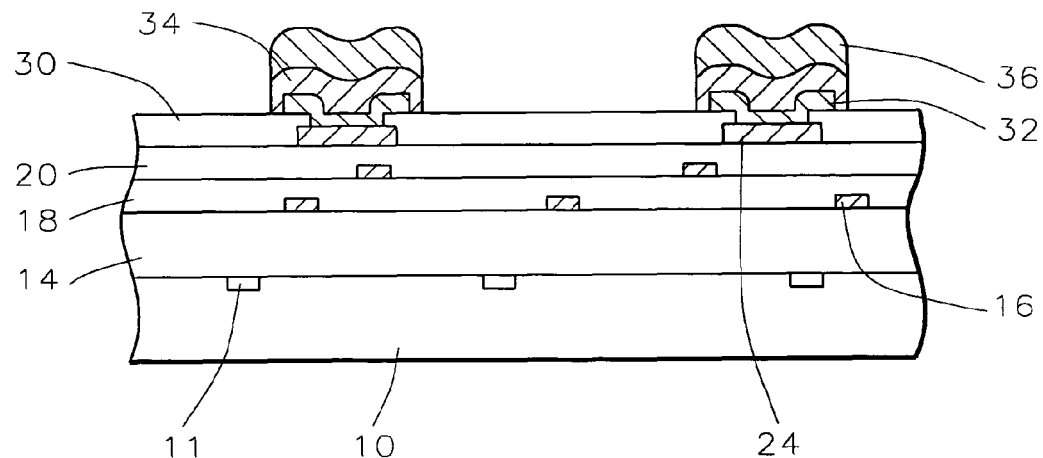
FIG. 3 shows a cross-sectional view of a testing application of the present invention.

Referring now to FIGS. 2 and 3, there is shown an example of a preferred embodiment of the present invention. Semiconductor substrate 10 is shown. Transistors and other devices 12 are formed in and on the semiconductor substrate 10. Multiple layers of conductive lines 16 and dielectric layers 14 are formed over the substrate. On the topmost intermetal dielectric layer 22, a copper contact pad 24 is formed. Passivation layer 30 is formed over the top metal layer 24. The passivation layer is used to protect the underlying devices, such as transistors, polysilicon resistors, poly-to-poly capacitors, and fine-line metal interconnections, not shown and the topmost interlevel dielectric layer from penetration of mobile ions (such as sodium ions), moisture, transition metal (such as gold or silver), and other contaminations. For example, the passivation layer may be a composite of oxide and nitride where the nitride is greater than about 0.3 µm in thickness.

A metal cap layer 32 is formed overlying the copper contact pad 24. An opening is made through the passivation layer to the copper contact pad 24. A metal layer is deposited by physical vapor deposition or by chemical vapor deposition into the opening and over the passivation layer. The metal layer is patterned to form the metal cap 32. The metal cap may be aluminum or an aluminum alloy.

Now, an adhesion/barrier layer 34 is deposited over the passivation layer and metal cap as shown in FIGS. 2 and 3. This adhesion/barrier layer is preferably titanium tungsten (TiW) if the post-passivation bulk metal is Au. For Cu bulk post-passivation, the adhesion/barrier layer is typically Cr, Ti, or TiW. Other possible barrier materials include titanium nitride, tantalum, and tantalum nitride. The adhesion/barrier layer is preferably deposited to a thickness of between about 2700 and 3300 Angstroms.

A gold (Au) or copper (Cu) seed layer is now deposited over the barrier layer 34 by sputtering or electroplating to cover the barrier layer as shown in the figures. The seed layer has a thickness of between about 900 and 1100 Angstroms. The substrate is coated with resist which is exposed and developed by a photolithography process, leaving openings where the metal body is to be formed. Now, the Au or Cu metal body is electroplated on the seed layer to a thickness of between about 2 µm and 20 µm. The resist is removed by an etching process. The barrier/adhesion layer is etched in a self-aligned etch. The barrier/adhesion layer covered by the Au or Cu metal body 36 remains while the barrier/adhesion layer elsewhere is etched away.

Now, Au wire 40 can be bonded to the Au pad 36 as shown in FIG. 2. Or, the copper contact pad 24 with Al cap 32 and Au pad 36 can be used for testing applications, as shown in FIG. 3.

The post-passivation interconnect process has been described in U.S. Pat. No. 6,383,916. The following figures illustrate the application of a metal cap with the post-passivation interconnect process.

Figure 4A:
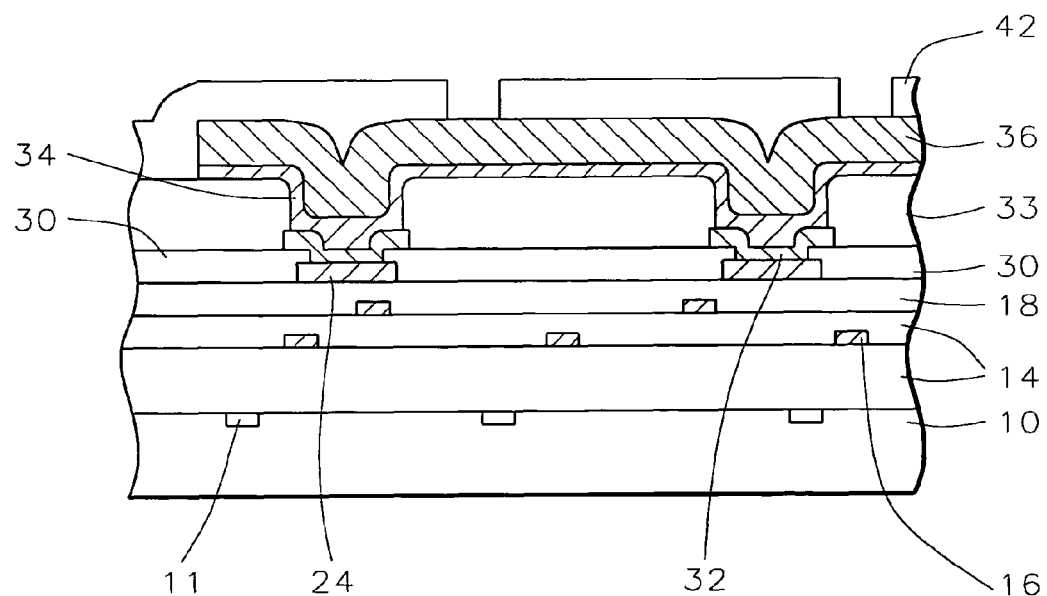
FIGS. 4A and 4B show cross-sectional views of a preferred embodiment of the present invention having a single post-passivation interconnect layer.

Referring now to FIG. 4A, there is shown a cross section of one implementation of U.S. Pat. No. 6,383,916 and the present invention. The surface of silicon substrate 10 has been provided with transistors 11 and other devices. The surface of substrate 10 is covered by interlevel dielectric (ILD) layers and intermetal dielectric layers (IMD) 14 and 18 formed over the devices.

Dielectric layers 14 and 18 contain one or more layers of dielectric, interspersed with one or more metal interconnect lines 16 that make up a network of electrical connections. At a topmost metal layer are points of electrical contact such as contact pads 24. A passivation layer 30, formed of, for example, a composite layer of silicon oxide and silicon nitride, is deposited over the surface of layer 18, and functions to prevent the penetration of mobile ions (such as sodium ions), moisture, transition metal (such as gold, silver), and other contamination. The passivation layer is used to protect the underlying devices (such as transistors, polysilicon resistors, poly-to-poly capacitors, etc.) and the fine-line metal interconnection.

Now, a metal (such as Al or an aluminum alloy) layer is deposited into the opening and over the passivation layer. The metal layer is patterned to form the metal cap 32.

A post-passivation interconnect dielectric layer 33 optionally is deposited over the passivation layer 20 and the Al metal layer 24. This dielectric layer 33 is preferably polyimide, BCB, a low dielectric constant (k) dielectric material, or an elastomer having a thickness of between about 2 μm and 20 μm through photolithographic process steps. Now, openings are made through the dielectric layer 33 to the metal caps 24.

Now, an adhesion/barrier layer 34 is deposited over the dielectric layer 33 and metal cap 24. This adhesion/barrier layer is preferably titanium tungsten (TiW). Other possible materials are TiN and TaN.

As described above, a gold (Au) or other metal is now electroplated to form metal pads 36 as shown in the FIG. 4A. For example, the 36 may be a gold meander line, shown connecting the two pads which allows the chip to conduct wire-bonding or testing without damaging the active devices. As both the Au layer and the dielectric layer 33 are able to absorb the mechanical shock caused by the poking process during testing or wire-bonding, damage to the active devices can be avoided.

Figure 4B:
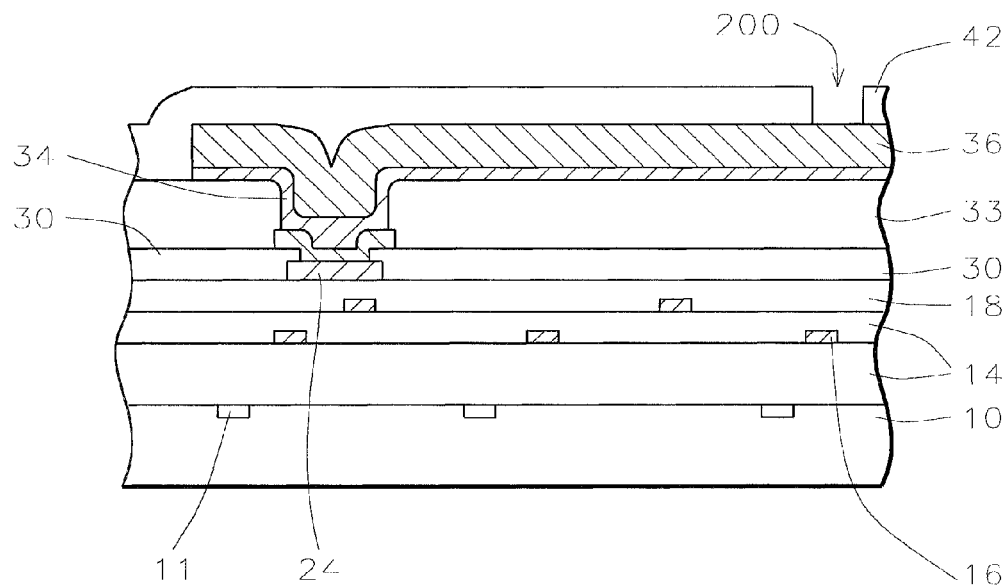

FIG. 4B shows another use of the gold pad. The gold may be used for pad relocation. For example, as shown in FIG. 4B, the gold line 36 contacts the metal pad 24. The gold line is extended away from the metal pad. A dielectric layer 42 is deposited overlying the gold line 36. An opening 200 may be made to the gold line. A wirebond can be formed at the relocation point 200. The region 200 of the extended gold pad could be used for a test probe.

Figure 5:
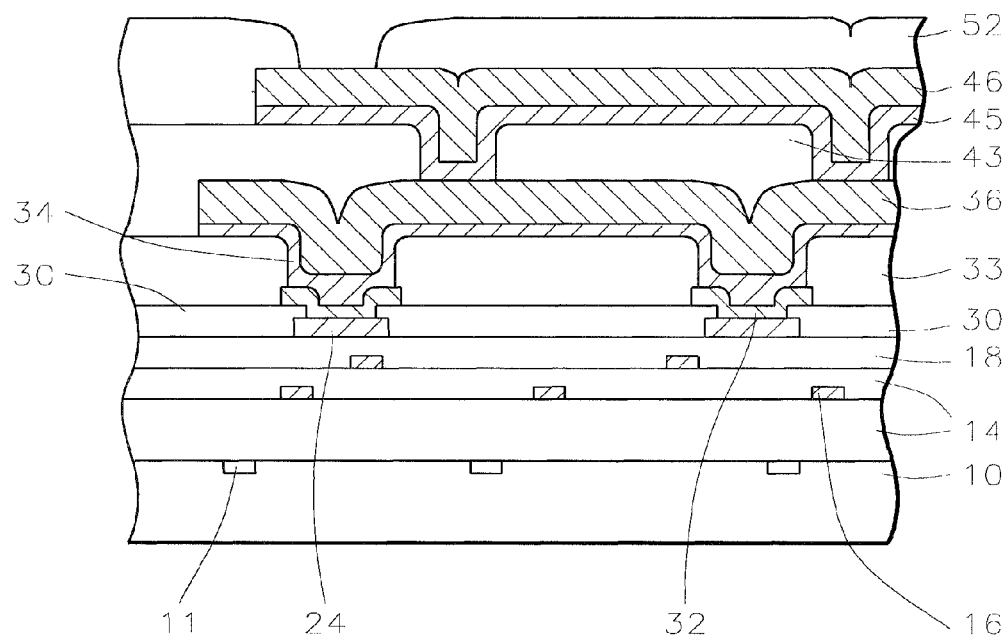
FIG. 5 shows a cross-sectional view of a preferred embodiment of the present invention having multiple post-passivation interconnect layers.

FIG. 5 shows another embodiment of the present invention. In this embodiment, after the metal line 36 is formed, a second post-passivation layer 43 is deposited over the metal line 36. Openings are made through the second dielectric layer 43 to the metal line 36. Now, an adhesion/barrier layer 45 is deposited over the dielectric layer 43 and within the openings. A gold (Au) or other metal layer is now formed in a similar manner to line 36 in FIG. 4 over the barrier layer 45 to form the metal line 46 as shown in the FIG. 5.

Figure 6:
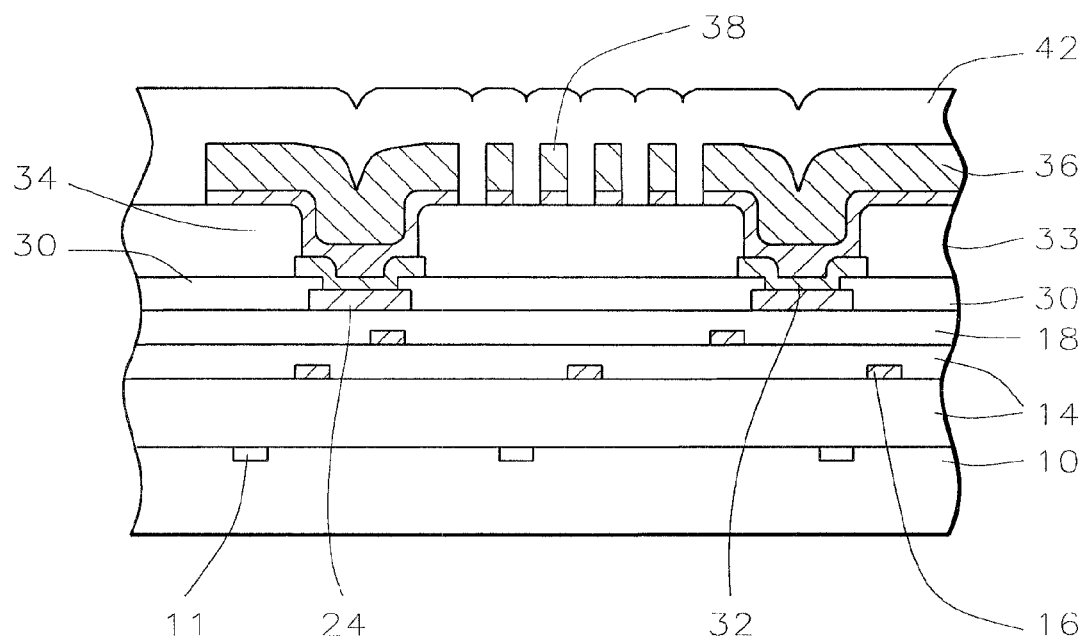
FIG. 6 shows a cross-sectional view of a preferred embodiment of the present invention including an inductor.

The process of the present invention can be used in forming a variety of discrete passive components in the post-passivation process. For example, FIG. 6 illustrates an inductor 38 formed from the metal layer 36 and barrier layer 34. Shown are metal lines 36 and inductor 38.

Figure 7:
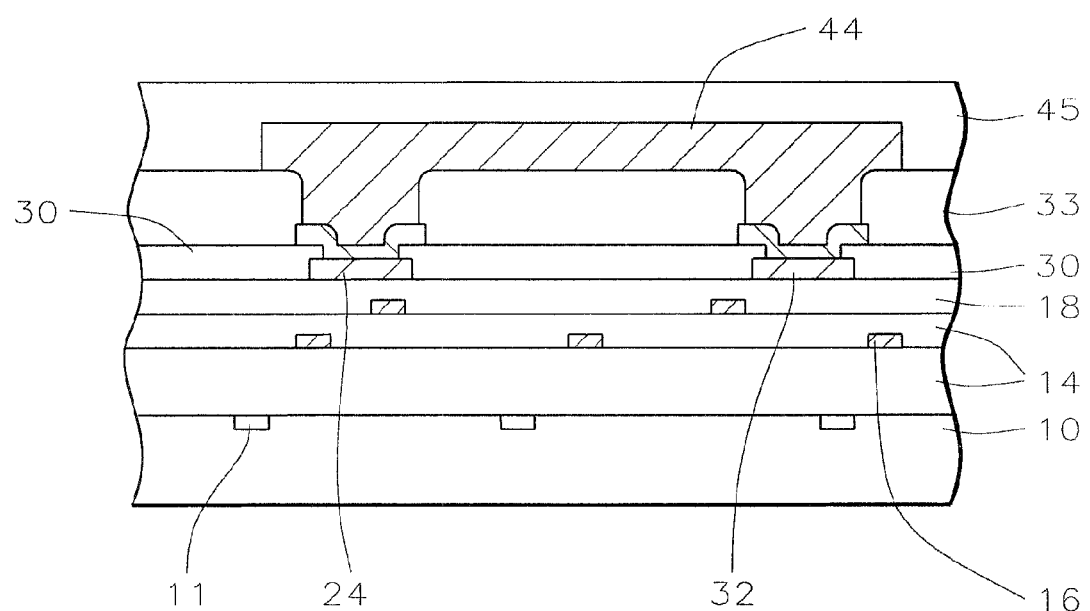
FIG. 7 shows a cross-sectional view of a preferred embodiment of the present invention including a resistor.

FIG. 7 illustrates the formation of a resistor 44. Dielectric layer 33 has been formed over the passivation layer 30 and Al or other metal caps 32. Openings are made through the dielectric layer 33 to the pads 24 having metal caps 32. A metal layer over the dielectric layer and within the openings forms the resistor 44. Optionally, a post-passivation layer 45 may be formed over the resistor 44.

Figure 8:
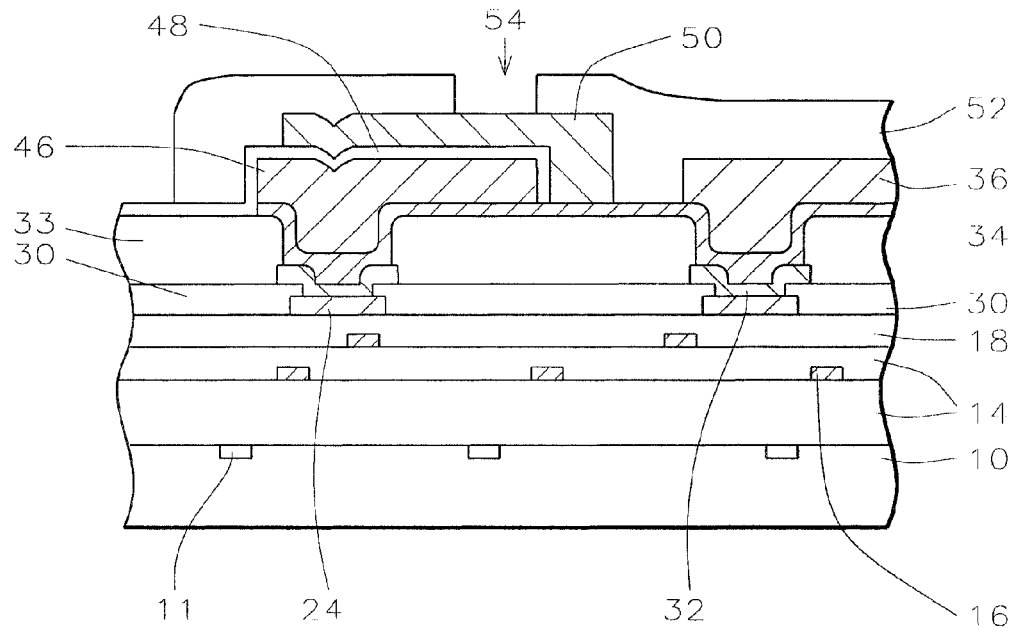
FIG. 8 shows a cross-sectional view of a preferred embodiment of the present invention including a capacitor formed by a first alternative process.

FIG. 8 illustrates the formation of a capacitor. Dielectric layer 33 has been formed over the passivation layer 30 and Al or other metal caps 32. Openings are made through the dielectric layer 33 to the pads 24 having metal caps 32. Adhesion/barrier layer 34 is deposited over the passivation layer and within the openings. A metal layer over the barrier layer 34 forms the metal line 36 and the bottom electrode of the capacitor 46. A capacitor dielectric layer 48 is deposited and etched away to leave the capacitor dielectric layer 48 on the top and sidewalls of the bottom electrode 46. A second conducting layer is used to form the top capacitor electrode 50 to complete formation of the capacitor.

A dielectric layer 52 is deposited overlying the capacitor and the metal line 36. An opening 54 is made through the dielectric layer 52 to the top electrode 50 for wire bonding or solder bonding.

Figure 9:
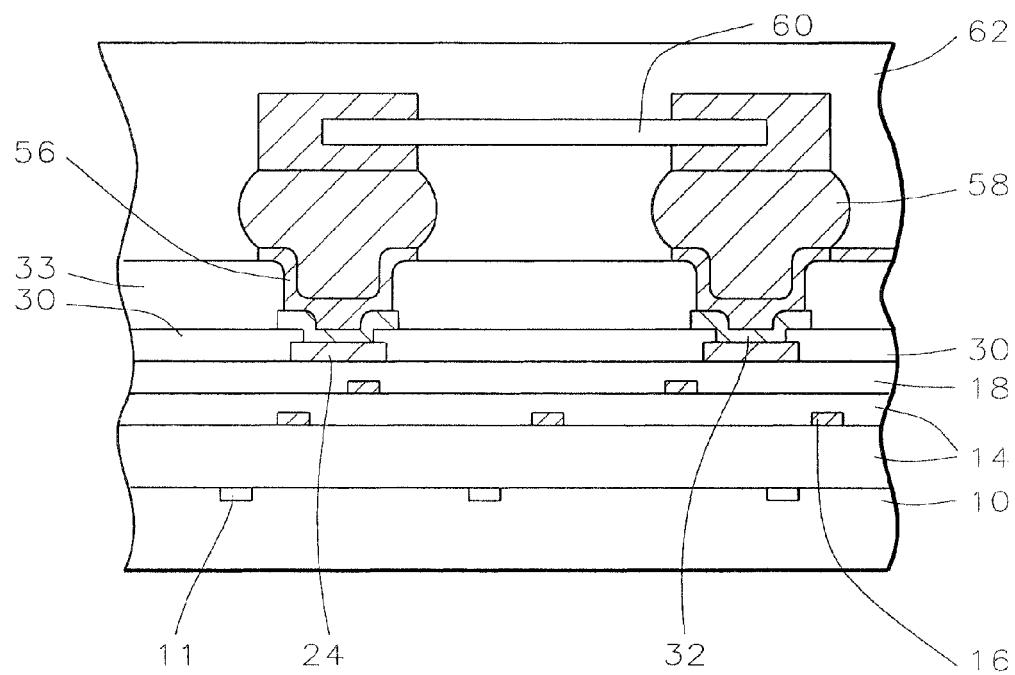
FIG. 9 shows a cross-sectional view of a preferred embodiment of the present invention including a capacitor formed by a second alternative process.

In another alternative, commercially available discrete capacitors are used. These capacitors have already been coated with solder at both ends (terminals or electrodes). Therefore, on the IC wafer, dielectric layer 33 is formed over the passivation layer 30 and Al or other metal caps 32. Openings are made through the dielectric layer 33 to the pads 24 having metal caps 32. A barrier or wetting layer 56 is deposited over the passivation layer and patterned to leave the wetting layer within and immediately surrounding the openings. Solder balls 58 are formed within and over the openings as shown in FIG. 9. The discrete capacitor 60 is attached to the IC by the solder balls 58. A dielectric layer 62 is deposited to cover the capacitor 60. Other discrete passive components can be surface mounted over the passivation layer in a similar manner.

While this invention has been particularly shown and described with reference to the preferred embodiments thereof, it will be understood by those skilled in the art that various changes in form and details may be made without departing from the spirit and scope of the invention.

The invention claimed is:

1. A process for fabricating a semiconductor chip comprising:
    providing a semiconductor substrate, a dielectric layer over said semiconductor substrate, a copper layer over said semiconductor substrate and in said dielectric layer, wherein said copper layer has a top surface substantially coplanar with a top surface of said dielectric layer, and a separating layer over said semiconductor substrate, on said top surface of said dielectric layer and on said top surface of said copper layer, wherein an opening in said separating layer is over a contact point of said top surface of said copper layer, and said contact point is at a bottom of said opening, wherein said separating layer comprises a nitride;
    forming a titanium-containing layer over said contact point and said separating layer;
    forming a first gold layer on said titanium-containing layer;
    after said forming said first gold layer, forming a resist layer;
    after said forming said resist layer, electroplating a second gold layer with a thickness between 2 and 20 micrometers over said first gold layer;
    after said electroplating said second gold layer, removing said resist layer; and
    after said removing said resist layer, removing said titanium-containing layer not under said second gold layer.

2. The process of claim 1 further comprising providing an aluminum-containing layer over said copper layer, followed by said forming said titanium-containing layer further over said aluminum-containing layer.

3. The process of claim 1, wherein said separating layer further comprises an oxide.

4. The process of claim 1, wherein said nitride has a thickness greater than 0.3 micrometers.

5. The process of claim 1, after said removing said titanium-containing layer not under said second gold layer, further comprising bonding a wire to said second gold layer.

6. A process for fabricating a semiconductor chip comprising:
   providing a semiconductor substrate, a dielectric layer over said semiconductor substrate, a copper layer over said semiconductor substrate and in said dielectric layer, wherein said copper layer has a top surface substantially coplanar with a top surface of said dielectric layer, a separating layer over said semiconductor substrate, on said top surface of said dielectric layer and on said top surface of said copper layer, wherein an opening in said separating layer is over a contact point of said top surface of said copper layer, and said contact point is at a bottom of said opening, wherein said separating layer comprises a nitride, and an aluminum-containing layer connected to said contact point through said opening; and
   forming a wirebonding pad connected to said aluminum-containing layer, wherein said forming said wirebonding pad comprises forming a first metal layer over said aluminum-containing layer and said separating layer, next forming a resist layer, next forming a second metal layer over said first metal layer, next removing said resist layer, and then removing said first metal layer not under said second metal layer.

7. The process of claim 6 further comprising said forming said wirebonding pad vertically over said aluminum-containing layer.

8. The process of claim 6, wherein said forming said wirebonding pad, after said forming said first metal layer, further comprises forming a third metal layer over said first metal layer, followed by said forming said resist layer.

9. The process of claim 6, wherein said forming said second metal layer comprises an electroplating process.

10. The process of claim 6, wherein said forming said first metal layer comprises forming a titanium-containing layer over said aluminum-containing layer and said separating layer.

11. The process of claim 6, wherein said forming said second metal layer comprises forming a gold layer with a thickness between 2 and 20 micrometers over said first metal layer.

12. The process of claim 6, wherein said separating layer further comprises an oxide.

13. The process of claim 6, wherein said nitride has a thickness greater than 0.3 micrometers.

14. The process of claim 6, after said forming said wirebonding pad, further comprising bonding a wire to said second metal layer.

15. A process for fabricating a semiconductor chip or wafer comprising:
   providing a semiconductor substrate, a dielectric layer over said semiconductor substrate, a copper layer over said semiconductor substrate and in said dielectric layer, wherein said copper layer has a top surface substantially coplanar with a top surface of said dielectric layer, a separating layer over said semiconductor substrate, on said top surface of said dielectric layer and on said top surface of said copper layer, wherein an opening in said separating layer is over a contact point of said top surface of said copper layer, and said contact point is at a bottom of said opening, wherein said separating layer comprises a nitride, and an aluminum-containing layer connected to said contact point through said opening;
   forming a first metal layer over said aluminum-containing layer and said separating layer;
   after said forming said first metal layer, forming a resist layer;
   after said forming said resist layer, forming a gold layer over said first metal layer;
   after said forming said gold layer, removing said resist layer; and
   after said removing said resist layer, removing said first metal layer not under said gold layer.

16. The process of claim 15, after said forming said first metal layer, further comprising forming a second metal layer over said first metal layer, followed by said forming said resist layer.

17. The process of claim 15, wherein said forming said gold layer comprises an electroplating process.

18. The process of claim 15, wherein said forming said first metal layer comprises forming a titanium-containing layer over said aluminum-containing layer and said separating layer.

19. The process of claim 15 further comprising said forming said gold layer with a thickness between 2 and 20 micrometers.

20. The process of claim 15 further comprising said forming said gold layer vertically over said aluminum-containing layer.

21. The process of claim 15, wherein said nitride has a thickness greater than 0.3 micrometers.

22. The process of claim 15, after said removing said first metal layer not under said gold layer, further comprising bonding a wire to said gold layer.

23. A semiconductor chip comprising:
   a semiconductor substrate;
   a dielectric layer over said semiconductor substrate;
   a copper layer over said semiconductor substrate and in said dielectric layer, wherein said copper layer has a top surface substantially coplanar with a top surface of said dielectric layer;
   a separating layer over said semiconductor substrate, on said top surface of said dielectric layer and on said top surface of said copper layer, wherein an opening in said separating layer is over a contact point of said top surface of said copper layer, and said contact point is at a bottom of said opening, wherein said separating layer comprises a nitride;
   an aluminum-containing layer connected to said contact point through said opening;
   a first gold layer over said aluminum-containing layer, wherein said first gold layer has a thickness between 2 and 20 micrometers; and
   a titanium-containing layer between said first gold layer and said aluminum-containing layer.

24. The semiconductor chip of claim 23, wherein said nitride has a thickness greater than 0.3 micrometers.

25. The semiconductor chip of claim 23, wherein said first gold layer is configured to have a wire bonded thereon.

26. The semiconductor chip of claim 23 further comprising a second gold layer under said first gold layer and over said titanium-containing layer.

27. The semiconductor chip of claim 23, wherein said separating layer further comprises an oxide.

* * * * *